United States Patent
Hao

(10) Patent No.: US 9,536,623 B2
(45) Date of Patent: Jan. 3, 2017

(54) GATE DRIVE CIRCUIT AND SHIFT REGISTER

(71) Applicant: Shenzhen China Star Optoelectronics Technology Co., Ltd., Shenzhen, Guangdong (CN)

(72) Inventor: Sikun Hao, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 115 days.

(21) Appl. No.: 14/437,492

(22) PCT Filed: Jan. 12, 2015

(86) PCT No.: PCT/CN2015/070515
§ 371 (c)(1),
(2) Date: Apr. 21, 2015

(87) PCT Pub. No.: WO2016/106821
PCT Pub. Date: Jul. 7, 2016

(65) Prior Publication Data
US 2016/0343451 A1    Nov. 24, 2016

(30) Foreign Application Priority Data
Dec. 30, 2014   (CN) .......................... 2014 1 0850825

(51) Int. Cl.
*G11C 19/00* (2006.01)
*G11C 19/28* (2006.01)
(Continued)

(52) U.S. Cl.
CPC ............. *G11C 19/28* (2013.01); *G09G 3/2092* (2013.01); *H03K 19/0008* (2013.01); *H03K 19/20* (2013.01); *G09G 2310/0286* (2013.01)

(58) Field of Classification Search
CPC ...................................................... G11C 19/00
See application file for complete search history.

(56) References Cited

U.S. PATENT DOCUMENTS

| 4,426,637 A | 1/1984 | Apple et al. |
| 5,825,210 A | 10/1998 | Oh et al. |

(Continued)

FOREIGN PATENT DOCUMENTS

| CN | 102654968 A | 9/2012 |
| CN | 103280176 A | 9/2013 |
| CN | 103401544 A | 11/2013 |

*Primary Examiner* — Hai L Nguyen
(74) *Attorney, Agent, or Firm* — Andrew C. Cheng

(57) ABSTRACT

The present invention discloses a gate drive circuit and a shift register. The gate drive circuit comprises a plurality of shift register circuits which are cascade connected, and each of the shift register circuits comprises a clock control transmission circuit and a NOR gate latch circuit, wherein the clock control transmission circuit is triggered by a first clock pulse of a clock signal to transmit a gate drive pulse of a former stage to the NOR gate latch circuit, and the NOR gate latch circuit performs latch, and the NOR gate latch circuit is further triggered by a second clock pulse following the first clock pulse to output the gate drive pulse. With the aforesaid arrangement, the gate drive circuit of the present invention is applicable to CMOS process, and the power consumption is low and the noise margin is wide.

10 Claims, 2 Drawing Sheets

(51) Int. Cl.
*H03K 19/00* (2006.01)
*H03K 19/20* (2006.01)
*G09G 3/20* (2006.01)

(56) References Cited

U.S. PATENT DOCUMENTS

| | | | |
|---|---|---|---|
| 7,310,057 B2 * | 12/2007 | Murata | H03M 9/00 341/101 |
| 2006/0066356 A1 | 3/2006 | Murata et al. | |
| 2006/0158394 A1 | 7/2006 | Choi et al. | |
| 2009/0185654 A1 | 7/2009 | Kang et al. | |
| 2011/0033022 A1 | 2/2011 | Zebedee et al. | |
| 2011/0199353 A1 | 8/2011 | Chung et al. | |
| 2015/0248867 A1 * | 9/2015 | Tan | G11C 19/28 345/100 |

* cited by examiner

GATE DRIVE CIRCUIT AND SHIFT REGISTER

FIELD OF THE INVENTION

The present invention relates to a display technology field, and more particularly to a gate drive circuit and a shift register.

BACKGROUND OF THE INVENTION

The GOA (Gate Drive On Array) circuit is to manufacture the gate scan drive circuit on the array substrate by utilizing the present liquid crystal display array process for achieving the driving method of scanning row by row. It possesses merits of the production cost decrease and the narrow frame design, and is utilized by many kinds of displays. The GOA circuit possesses two fundamental functions: one is to input the gate drive pulse to drive the gate line in the panel, and to activate the TFT (Thin Film Transistor) in the display area for charging the pixel via the gate line; two is for the shift register, and as the output of the nth gate drive pulse is accomplished, the output of the n+1th gate drive pulse can be performed with clock control and so on.

The GOA circuit comprises a Pull-up circuit, a Pull-up control circuit, a Pull-down circuit, a Pull-down control and a Boost circuit in charge of boosting voltage level. Specifically, the pull-up circuit is mainly in charge of outputting the inputted clock signal (Clock) to the gate of the thin film transistor as being the driving signals of the liquid crystal display. The pull-up control circuit is in charge of activating the pull-up circuit, and is generally functioned by the signal transferred from the GOA circuit of the former stage. The Pull-down circuit is in charge of rapidly pulling down the scan signal to low voltage level after outputting the scan signal. That is, the voltage level of the gate of the thin film transistor is pulled down to be low voltage level; the Pull-down holding circuit is in charge of keeping the scan signal and the signal of the Pull-up circuit (Q point in general) in off state (i.e. the set negative voltage level), and generally, two Pull-down holding circuits function, alternately. The boost circuit is in charge of a second boost to the voltage level of the Q point for ensuring the G(N) normal output of the pull-up circuit.

Different GOA circuits can utilize different processes. The Low Temperature Poly-Silicon (LTPS) process possesses advantages of higher electron mobility and mutual technology, which is widely utilized in the small and medium displays. The CMOS (Complementary Metal Oxide Semiconductor) LTPS process possesses advantages of low power consumption, higher electron mobility and wide noise margin, and thus is gradually utilized by panel makers. Therefore, there is a need to develop the GOA circuit corresponding to the CMOS LTPS process.

SUMMARY OF THE INVENTION

The embodiment of the present invention provides a gate drive circuit and a shift register, applicable to CMOS process, and the power consumption is low and the noise margin is wide.

The present invention provides a gate drive circuit, comprising a plurality of shift register circuits which are cascade connected, and each of the shift register circuits comprises a clock control transmission circuit and a NOR gate latch circuit, wherein the clock control transmission circuit is triggered by a first clock pulse of a clock signal to transmit a gate drive pulse of a former stage to the NOR gate latch circuit, and the NOR gate latch circuit performs latch, and the NOR gate latch circuit is further triggered by a second clock pulse following the first clock pulse to output the gate drive pulse; wherein the clock control transmission circuit and the NOR gate latch circuit respectively are rising edge triggered; the NOR gate latch circuit at least comprises a first inverter, a first NOR gate, a second NOR gate and a NAND gate, wherein an input end of the first inverter is coupled to an output end of the clock control transmission circuit, and a first input end of the first NOR gate is coupled to an output end of the first inverter, and a second input end of the first NOR gate is coupled to an output end of the second NOR gate, and a first input end of the second NOR gate is coupled to the input end of the first inverter, and a second input end of the second NOR gate is coupled to an output end of the first NOR gate, and the output end of the second NOR gate is further coupled to a first input end of the NAND gate, and a second input end of the NAND gate receives the clock signal.

The clock control transmission circuit inverts the gate drive pulse during a process of transmitting the gate drive pulse.

The NOR gate latch circuit further comprises a multi-stage inverter circuit coupled to an output end of the NAND gate.

The multi-stage inverter circuit comprises a plurality of second inverters in series.

The amount of the second inverters is three.

The clock signals of the adjacent shift registers are mutually inverse.

The present invention provides a gate drive circuit, comprising a plurality of shift register circuits which are cascade connected, and each of the shift register circuits comprises a clock control transmission circuit and a NOR gate latch circuit, wherein the clock control transmission circuit is triggered by a first clock pulse of a clock signal to transmit a gate drive pulse of a former stage to the NOR gate latch circuit, and the NOR gate latch circuit performs latch, and the NOR gate latch circuit is further triggered by a second clock pulse following the first clock pulse to output the gate drive pulse.

The clock control transmission circuit and the NOR gate latch circuit respectively are rising edge triggered.

The NOR gate latch circuit at least comprises a first inverter, a first NOR gate, a second NOR gate and a NAND gate, wherein an input end of the first inverter is coupled to an output end of the clock control transmission circuit, and a first input end of the first NOR gate is coupled to an output end of the first inverter, and a second input end of the first NOR gate is coupled to an output end of the second NOR gate, and a first input end of the second NOR gate is coupled to the input end of the first inverter, and a second input end of the second NOR gate is coupled to an output end of the first NOR gate, and the output end of the second NOR gate is further coupled to a first input end of the NAND gate, and a second input end of the NAND gate receives the clock signal.

The clock control transmission circuit inverts the gate drive pulse during a process of transmitting the gate drive pulse.

The NOR gate latch circuit further comprises a multi-stage inverter circuit coupled to an output end of the NAND gate.

The multi-stage inverter circuit comprises a plurality of second inverters in series.

The amount of the second inverters is three.

The clock signals of the adjacent shift registers are mutually inverse.

The present invention further provides a shift register, comprising a clock control transmission circuit and a NOR gate latch circuit, and the NOR gate latch circuit at least comprises a first inverter, a first NOR gate, a second NOR gate and a NAND gate, wherein an input end of the first inverter is coupled to an output end of the clock control transmission circuit, and a first input end of the first NOR gate is coupled to an output end of the first inverter, and a second input end of the first NOR gate is coupled to an output end of the second NOR gate, and a first input end of the second NOR gate is coupled to the input end of the first inverter, and a second input end of the second NOR gate is coupled to an output end of the first NOR gate, and the output end of the second NOR gate is further coupled to a first input end of the NAND gate.

The NOR gate latch circuit further comprises a multi-stage inverter circuit coupled to an output end of the NAND gate.

The multi-stage inverter circuit comprises a plurality of second inverters in series.

The amount of the second inverters is three.

With the aforesaid solutions, the benefits of the present invention are: in the gate drive circuit of the present invention, the clock control transmission circuit is triggered by a first clock pulse of a clock signal to transmit a gate drive pulse of a former stage to the NOR gate latch circuit, and the NOR gate latch circuit performs latch, and the NOR gate latch circuit is further triggered by a second clock pulse following the first clock pulse to output the gate drive pulse. Thus, it is applicable to CMOS process, and the power consumption is low and the noise margin is wide.

BRIEF DESCRIPTION OF THE DRAWINGS

In order to more clearly illustrate the embodiments of the present invention, the following figures will be described in the embodiments are briefly introduced. It is obvious that the drawings are only some embodiments of the present invention, those of ordinary skill in this field can obtain other figures according to these figures without paying the premise. wherein.

DETAILED DESCRIPTION OF PREFERRED EMBODIMENTS

Embodiments of the present invention are described in detail with the technical matters, structural features, achieved objects, and effects with reference to the accompanying drawings as follows. It is clear that the described embodiments are merely part of embodiments of the present invention, but not all embodiments. Based on the embodiments of the present invention, all other embodiments to those of ordinary skill in the premise of no creative efforts obtained, should be considered within the scope of protection of the present invention.

Figure 1:
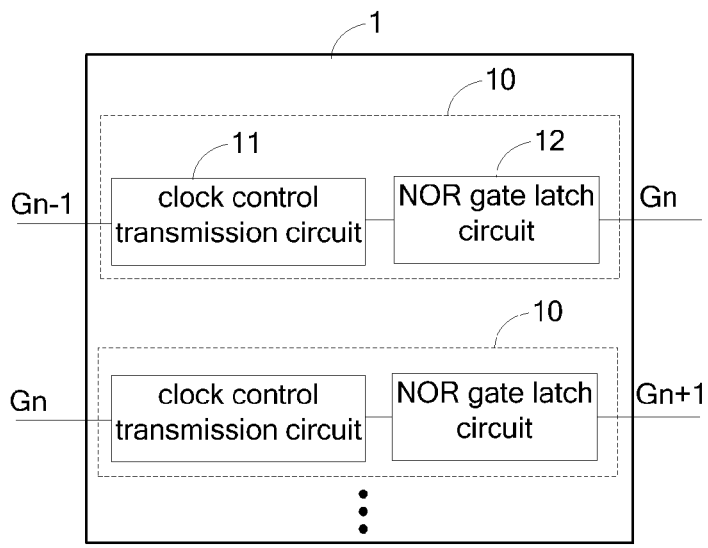
FIG. 1 is a structural diagram of a gate drive circuit according to the embodiment of the present invention.

Please refer to FIG. 1. FIG. 1 is a structural diagram of a gate drive circuit according to the embodiment of the present invention. As shown in FIG. 1, the gate drive circuit 1 disclosed by the embodiment of the present invention comprises a plurality of shift register circuits 10 which are cascade connected, and each of the shift register circuits 10 comprises a clock control transmission circuit 11 and a NOR gate latch circuit 12, wherein the clock control transmission circuit 11 is triggered by a first clock pulse of a clock signal to transmit a gate drive pulse of a former stage to the NOR gate latch circuit 12, and the NOR gate latch circuit 12 performs latch, and the NOR gate latch circuit 12 is further triggered by a second clock pulse following the first clock pulse to output the gate drive pulse. The clock control transmission circuit 11 inverts the gate drive pulse during a process of transmitting the gate drive pulse. Meanwhile, the clock control transmission circuit 11 and the NOR gate latch circuit 12 respectively are rising edge triggered. The embodiment of the present invention controls former-latter stage signal transfer with the clock control transmission circuit 11 and latches signal with the NOR gate latch circuit 12, which is applicable to CMOS process, and the power consumption is low and the noise margin is wide.

Figure 2:
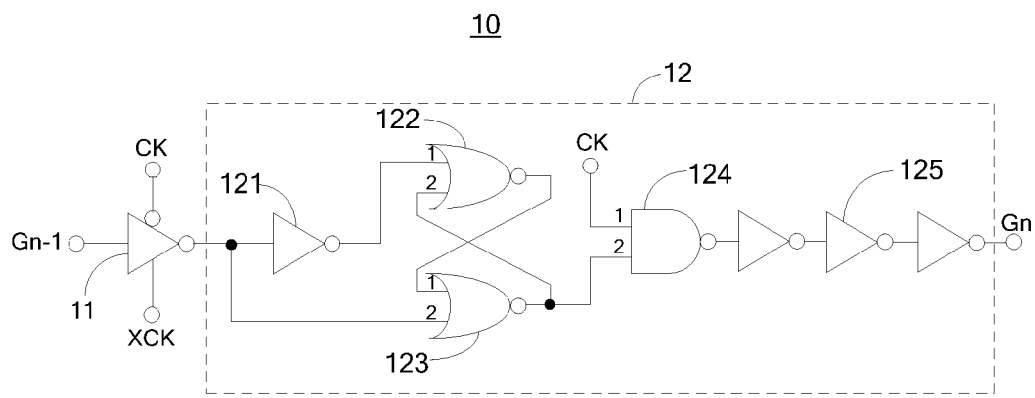
FIG. 2 is circuit diagram of a shift register shown in FIG. 1.

In the specific embodiments, as shown in FIG. 2, the NOR gate latch circuit 12 at least comprises a first inverter 121, a first NOR gate 122, a second NOR gate 123 and a NAND gate 124, wherein an input end of the first inverter 121 is coupled to an output end of the clock control transmission circuit 11, and a first input end of the first NOR gate 122 is coupled to an output end of the first inverter 121, and a second input end of the first NOR gate 122 is coupled to an output end of the second NOR gate 123, and a first input end of the second NOR gate 123 is coupled to the input end of the first inverter 121, and a second input end of the second NOR gate 123 is coupled to an output end of the first NOR gate 122, and the output end of the second NOR gate 123 is further coupled to a first input end of the NAND gate 124, and a second input end of the NAND gate 124 receives the clock signal CK. The NOR gate latch circuit 12 further comprises a multi-stage inverter circuit coupled to an output end of the NAND gate to promote the drive capability of the gate drive circuit 1. The multi-stage inverter circuit comprises a plurality of second inverters 124 in series. Preferably, the amount of the second inverters 124 is three.

The specific working principle of the shift register circuits 10 is: as the first clock pulse of the clock signal CK is at rising edge, the clock control transmission circuit 11 is triggered to transmit the gate drive pulse Gn−1 of the former stage to the first inverter 121. The gate drive pulse Gn−1 is inverted during the process of transmission, and then, is transmitted to the first NOR gate 122 and the second NOR gate 123 via the first inverter 121. The gate drive pulse Gn−1 of the former stage is latched with the first NOR gate 122 and the second NOR gate 123 of crossing connection. As the second clock pulse of the clock signal CK is at rising edge, i.e. the next clock pulse of the clock signal CK is at rising edge, the NOR gate latch circuit 12 is triggered, and the gate drive pulse Gn−1 of the former stage latched with the first NOR gate 122 and the second NOR gate 123 of crossing connection is transmitted to the second inverter 124, and then is transmitted to the gate Gn of the latter stage via the second inverter 124. The clock control transmission circuit 11 further comprises a clock signal XCK, and the clock signal XCK and the clock signal CK are inverse in phase.

Figure 3:
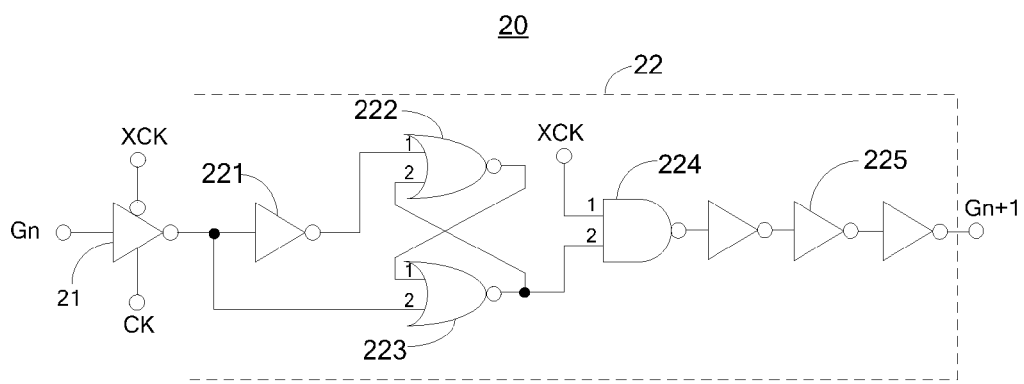
FIG. 3 is a circuit diagram of a shift register according to the second embodiment of the present invention.

In the embodiments of the present invention, the clock signals of the adjacent shift registers are mutually inverse. Please refer to FIG. 3. The shift register 20 comprises a clock control transmission circuit 21 and a NOR gate latch circuit 22. The NOR gate latch circuit 22 at least comprises a first inverter 221, a first NOR gate 222, a second NOR gate 223 and a NAND gate 224, wherein an input end of the first inverter 221 is coupled to an output end of the clock control transmission circuit 21, and a first input end of the first NOR gate 222 is coupled to an output end of the first inverter 221, and a second input end of the first NOR gate 222 is coupled to an output end of the second NOR gate 223, and a first input end of the second NOR gate 223 is coupled to the input end of the first inverter 221, and a second input end of the second NOR gate 223 is coupled to an output end of the first NOR gate 222, and the output end of the second NOR gate 223 is further coupled to a first input end of the NAND gate 224, and a second input end of the NAND gate 224 receives the clock signal XCK. The NOR gate latch circuit 22 further comprises a multi-stage inverter circuit coupled to an output end of the NAND gate to promote the drive capability of the gate drive circuit 1. The multi-stage inverter circuit comprises a plurality of second inverters 224 in series. Preferably, the amount of the second inverters 224 is three.

The specific working principle of the shift register circuits 20 is: as the first clock pulse of the clock signal XCK is at rising edge, the clock control transmission circuit 21 is triggered to transmit the gate drive pulse Gn of the latter stage to the first inverter 221. The gate drive pulse Gn of the latter stage is inverted during the process of transmission, and then, is transmitted to the first NOR gate 222 and the second NOR gate 223 via the first inverter 221. The gate drive pulse Gn of the latter stage is latched with the first NOR gate 222 and the second NOR gate 223 of crossing connection. As the second clock pulse of the clock signal XCK is at rising edge, i.e. the next clock pulse of the clock signal XCK is at rising edge, the NOR gate latch circuit 22 is triggered, and the gate drive pulse Gn of the latter stage latched with the first NOR gate 222 and the second NOR gate 223 of crossing connection is transmitted to the second inverter 224, and then is transmitted to the gate Gn+1 of the third stage via the second inverter 224. The clock control transmission circuit 21 further comprises a clock signal XCK, and the clock signal XCK and the clock signal CK are inverse in phase.

Figure 4:
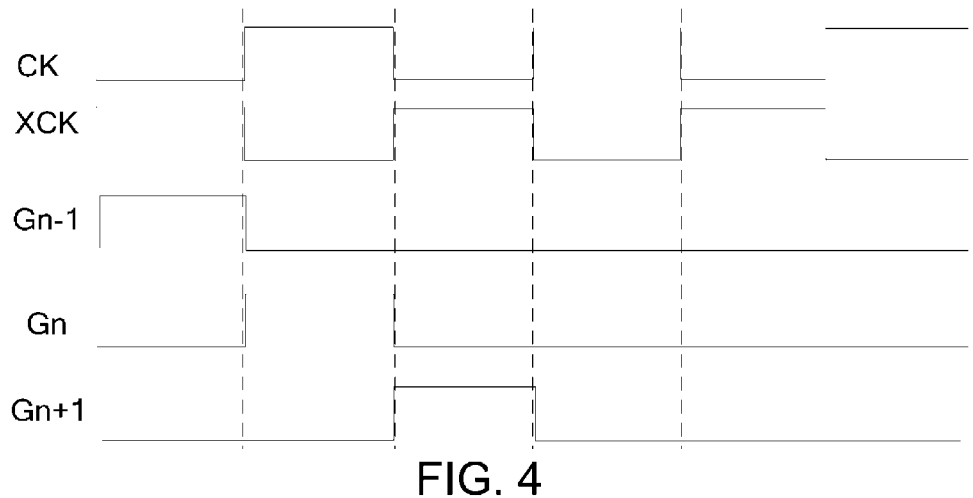
FIG. 4 is a theoretical sequence diagram of the gate drive circuit according to the embodiment of the present invention.
Figure 5:
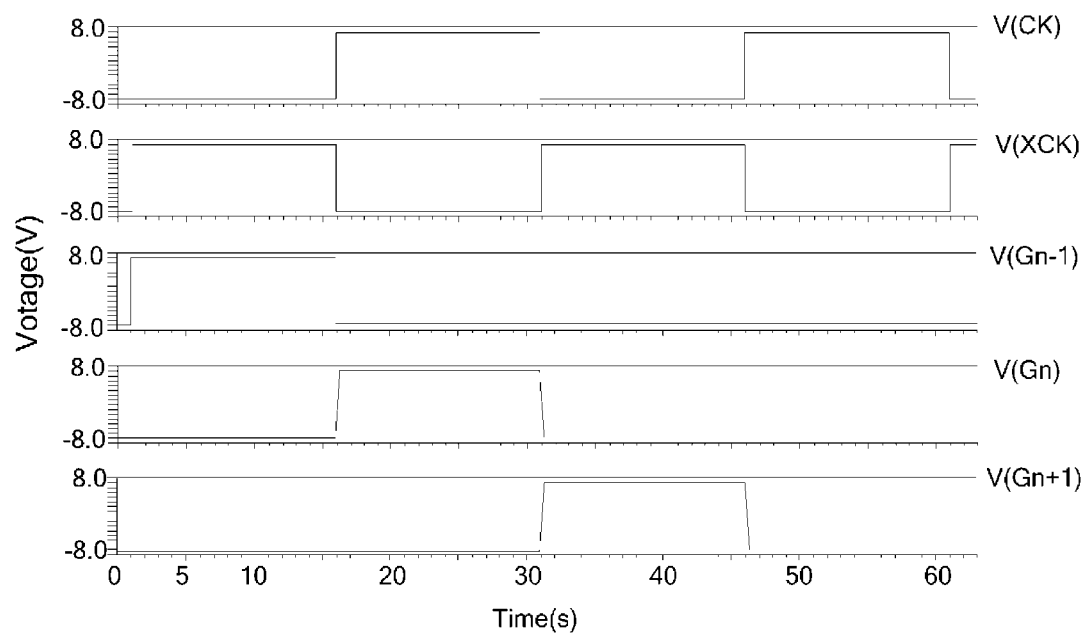
FIG. 5 is a simulate sequence diagram of the gate drive circuit according to the embodiment of the present invention.

In the embodiments of the present invention, the shift registers 10 and the shift registers 20 are adjacent. In practical application, the plurality of shift register circuits which are cascade connected in the gate drive circuit 1 can be divided into odd stages and even stages. The shift registers 10 can be employed as odd stage shift registers, and the shift registers 20 can be even stage shift registers. Alternatively, the shift registers 20 can be employed as odd stage shift registers, and the shift registers 10 can be even stage shift registers. Please refer to FIG. 4. FIG. 4 is a theoretical sequence diagram of the gate drive circuit according to the embodiment of the present invention. The shift registers 10 are employed as odd stage shift registers, and the shift registers 20 are even stage shift registers. As shown in figure, the clock signal CK and the clock signal XCK are inverse in phase. As the clock signal CK is at rising edge, the gate drive pulse Gn−1 of the former stage is transmitted to the gate of the latter stage, i.e. the gate drive pulse Gn−1 of the former stage is changed from high voltage level to low voltage level, and the gate drive pulse Gn of the latter stage is changed from low voltage level to high voltage level to drive the corresponding gate. As the clock signal XCK is at rising edge, the gate drive pulse Gn of the latter stage is transmitted to the gate of the third stage, i.e. the gate drive pulse Gn of the latter stage is changed from high voltage level to low voltage level, and the gate drive pulse Gn+1 of the third stage is changed from low voltage level to high voltage level to drive the corresponding gate. FIG. 5 is a simulate sequence diagram of the gate drive circuit according to the embodiment of the present invention. Please refer to FIG. 5, Y-axis is voltage, and X-axis is time. As shown in figure, the simulate sequence of the gate drive circuit is the same as the theoretical sequence in FIG. 4.

The present invention further provides a shift register, as shown in FIG. 2, the shift register comprises a clock control transmission circuit 11 and a NOR gate latch circuit 12. The NOR gate latch circuit 12 at least comprises a first inverter 121, a first NOR gate 122, a second NOR gate 123 and a NAND gate 124, wherein an input end of the first inverter 121 is coupled to an output end of the clock control transmission circuit 11, and a first input end of the first NOR gate 122 is coupled to an output end of the first inverter 121, and a second input end of the first NOR gate 122 is coupled to an output end of the second NOR gate 123, and a first input end of the second NOR gate 123 is coupled to the input end of the first inverter 121, and a second input end of the second NOR gate 123 is coupled to an output end of the first NOR gate 122, and the output end of the second NOR gate 123 is further coupled to a first input end of the NAND gate 124, and a second input end of the NAND gate 124 receives the clock signal CK. The NOR gate latch circuit 12 further comprises a multi-stage inverter circuit coupled to an output end of the NAND gate to promote the drive capability. The multi-stage inverter circuit comprises a plurality of second inverters 124 in series. Preferably, the amount of the second inverters 124 is three.

The specific working principle of the shift register circuits 10 is: as the first clock pulse of the clock signal CK is at rising edge, the clock control transmission circuit 11 is triggered to transmit the gate drive pulse Gn−1 of the former stage to the first inverter 121. The gate drive pulse Gn−1 is inverted during the process of transmission, and then, is transmitted to the first NOR gate 122 and the second NOR gate 123 via the first inverter 121. The gate drive pulse Gn−1 of the former stage is latched with the first NOR gate 122 and the second NOR gate 123 of crossing connection. As the second clock pulse of the clock signal CK is at rising edge, i.e. the next clock pulse of the clock signal CK is at rising edge, the NOR gate latch circuit 12 is triggered, and the gate drive pulse Gn−1 of the former stage latched with the first NOR gate 122 and the second NOR gate 123 of crossing connection is transmitted to the second inverter 124, and then is transmitted to the gate Gn of the latter stage via the second inverter 124. The clock control transmission circuit 11 further comprises a clock signal XCK, and the clock signal XCK and the clock signal CK are inverse in phase. In the embodiments of the present invention, by composing the gate drive circuit with the plurality of shift register 10 which are cascade connected, the adjacent shift register circuits are controlled with the clock signals inverse in phase. The former-latter stage signal transfer is controlled with the clock control transmission circuit 11 and signal is latched with the NOR gate latch circuit 12, which is applicable to CMOS process, and the power consumption is low and the noise margin is wide.

In conclusion, in the gate drive circuit of the present invention, the clock control transmission circuit is triggered by a first clock pulse of a clock signal to transmit a gate drive pulse of a former stage to the NOR gate latch circuit, and the NOR gate latch circuit performs latch, and the NOR gate latch circuit is further triggered by a second clock pulse following the first clock pulse to output the gate drive pulse. Thus, it is applicable to CMOS process, and the power consumption is low and the noise margin is wide.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A gate drive circuit, wherein the gate drive circuit comprises a plurality of shift register circuits which are cascade connected, each of the shift register circuits comprises a clock control transmission circuit and a NOR gate latch circuit, wherein the clock control transmission circuit is triggered by a first clock pulse of a clock signal to transmit a gate drive pulse of a former stage to the NOR gate latch circuit, and the NOR gate latch circuit performs latch, and the NOR gate latch circuit is further triggered by a second clock pulse following the first clock pulse to output the gate drive pulse;

wherein the clock control transmission circuit and the NOR gate latch circuit respectively are rising edge triggered; the NOR gate latch circuit at least comprises a first inverter, a first NOR gate, a second NOR gate and a NAND gate, wherein an input end of the first inverter is coupled to an output end of the clock control transmission circuit, and a first input end of the first NOR gate is coupled to an output end of the first inverter, and a second input end of the first NOR gate is coupled to an output end of the second NOR gate, and a first input end of the second NOR gate is coupled to the input end of the first inverter, and a second input end of the second NOR gate is coupled to an output end of the first NOR gate, and the output end of the second NOR gate is further coupled to a first input end of the NAND gate, and a second input end of the NAND gate receives the clock signal.

2. The drive circuit according to claim 1, wherein the clock control transmission circuit inverts the gate drive pulse during a process of transmitting the gate drive pulse.

3. The drive circuit according to claim 1, wherein the NOR gate latch circuit further comprises a multi-stage inverter circuit coupled to an output end of the NAND gate.

4. The drive circuit according to claim 1, wherein a multi-stage inverter circuit comprises a plurality of second inverters in series.

5. The drive circuit according to claim 4, wherein an amount of the second inverters is three.

6. The drive circuit according to claim 1, wherein the clock signals of the adjacent shift registers are mutually inverse.

7. A shift register, wherein the shift register comprises a clock control transmission circuit and a NOR gate latch circuit, and the NOR gate latch circuit at least comprises a first inverter, a first NOR gate, a second NOR gate and a NAND gate, wherein an input end of the first inverter is coupled to an output end of the clock control transmission circuit, and a first input end of the first NOR gate is coupled to an output end of the first inverter, and a second input end of the first NOR gate is coupled to an output end of the second NOR gate, and a first input end of the second NOR gate is coupled to the input end of the first inverter, and a second input end of the second NOR gate is coupled to an output end of the first NOR gate, and the output end of the second NOR gate is further coupled to a first input end of the NAND gate.

8. The shift register according to claim 7, wherein the NOR gate latch circuit further comprises a multi-stage inverter circuit coupled to an output end of the NAND gate.

9. The shift register according to claim 7, wherein a multi-stage inverter circuit comprises a plurality of second inverters in series.

10. The drive circuit according to claim 9, wherein an amount of the second inverters is three.

* * * * *